United States Patent [19]

Carney et al.

[11] Patent Number: 5,075,258

[45] Date of Patent: Dec. 24, 1991

[54] METHOD FOR PLATING TAB LEADS IN AN ASSEMBLED SEMICONDUCTOR PACKAGE

[75] Inventors: Francis J. Carney; Cary B. Powell, both of Gilbert; George F. Carney; Marion I. Simmons, both of Tempe, all of Ariz.

[73] Assignee: Motorola, Inc., Schaumburg, Ill.

[21] Appl. No.: 560,915

[22] Filed: Jul. 31, 1990

[51] Int. Cl.$^5$ .............................................. C25D 3/30
[52] U.S. Cl. .................................. 437/230; 437/246; 437/247; 437/248; 148/269; 148/282; 427/98; 427/433; 427/437
[58] Field of Search ............... 437/210, 220, 230, 246, 437/247, 248; 148/269, 282, 242; 228/209; 427/98, 328, 405, 433, 437, 329

[56] References Cited

U.S. PATENT DOCUMENTS

| | | | |
|---|---|---|---|
| 3,988,518 | 8/1976 | McGrath | 427/178 |
| 4,065,625 | 12/1977 | Iwai et al. | 428/620 |
| 4,234,631 | 11/1980 | Davis | 427/98 |
| 4,486,511 | 12/1984 | Chen et al. | 420/570 |
| 4,695,481 | 9/1987 | Kawamata et al. | 427/98 |
| 4,776,508 | 10/1988 | Tanny | 437/329 |
| 4,883,774 | 11/1989 | Djennas et al. | 437/210 |

FOREIGN PATENT DOCUMENTS 3040676  5/1982  Fed. Rep. of Germany ...... 437/220

OTHER PUBLICATIONS

*Binary Alloy Phase Diagrams*, American Society for Metals, 1986, p. 965.
*Hackh's Chemical Dictionary*, McGraw-Hill, Inc., 1969, p. 351.

Primary Examiner—Olik Chaudhuri
Assistant Examiner—David E. Graybill
Attorney, Agent, or Firm—Joe E. Barbee

[57] ABSTRACT

A method for improving the bonding characteristics of TAB semiconductor packages to circuit boards is achieved by plating additional amounts of tin on the TAB semiconductor package leads after final package assembly is complete. Residues from the plating step are removed from the package assembly to prevent contamination. Stresses that were developed in the plated material during the plating step are removed by heating the leads.

9 Claims, 1 Drawing Sheet

METHOD FOR PLATING TAB LEADS IN AN ASSEMBLED SEMICONDUCTOR PACKAGE

BACKGROUND OF THE INVENTION

This invention relates, in general, to improving the bondability of tape automated bonding (TAB) semiconductor package leads to circuit boards and more specifically to depositing tin over copper-tin intermetallic compounds that form on tin plated copper TAB leads during manufacturing, burn-in, and storage that reduce TAB lead bondability.

The increasing demand for economical high lead count semiconductors lead to the use of TAB (tape automated bonding) leads as an interconnecting mechanism between a semiconductor die and a circuit board. One of the TAB structures utilized tin plated copper as the TAB leads. Intermetallic compounds formed on these type TAB leads during manufacturing, burn-in, and storage of completed TAB semiconductor packages. The intermetallic compounds reduced the amount of tin on the lead's surface thereby reducing the reliability of TAB lead bonds to circuit boards and limited the package's usefulness. Bonding TAB leads that contain insufficient amounts of tin on the lead surface to a circuit board required the use of strong, difficult to remove bonding fluxes. These fluxes, and their removal after bonding, damaged the thin delicate TAB leads. Therefore, it is desirable to have sufficient amounts of tin on the leads to permit circuit board bonding with mild, easy to remove bonding fluxes and thereby minimize damage to the TAB leads.

During intermetallic compound formation, copper in the lead frame combined with the plated tin that would normally be available for bonding the leads to a circuit board. Before a reliable bond could occur, the intermetallic compound that had formed had to be covered by a new application of tin. Tin application techniques for TAB leads included both electrolytic tin deposition, and selective electrolytic plating of tin onto the TAB lead section to be attached to a circuit board.

Electrolytic re-plating of the TAB leads after TAB semiconductor package assembly required a TAB lead frame that was originally designed and manufactured with special conducting bars in the TAB lead frame. The conducting bars were required for plating current flow in the area to be plated. These re-plating bars shorted all leads together and prevented the packaged device from being tested until the bars were removed from the lead frame. Since the packaged device had to be tested at several manufacturing stages before it was plated, these plating bars complicated the manufacturing process and increased manufacturing costs. Additionally electrolytic re-plating was difficult to control on TAB leads after the package assembly process was complete. Complicating the lack of electrolytic re-plating control were the TAB lead shapes on a lead frame. Leads varied in length, number of bends, and angle of bends all of which added to the difficulty of controlling electrolytic re-plating current densities and associated plating thickness. Electrolytic re-plating limited the TAB lead frame application to one particular die, increased costs, and restricted testing.

When the TAB lead frame was manufactured, selectively plating a thick tin layer on the TAB lead portion to be attached to a circuit board would provide additional tin on the lead surface, and reduce the impact of intermetallic formation. However, the amount of tin required to maintain a surface layer of tin after intermetallic compound formation was determined by TAB storage time, in addition to the time and temperature of the TAB semiconductor package assembly process. Consequently it was difficult to determine, during lead frame manufacturing, the correct amount of tin required to completely eliminate the impact of intermetallics that subsequently formed. This characteristic combined with the high cost, testing restrictions, and the difficulty to control limited the use of selectively plating TAB leads.

Accordingly it would be desirable to have a low cost, controllable process for depositing the tin layer required on TAB semiconductor package outer leads.

SUMMARY OF THE INVENTION

The objects and advantages of the present invention are achieved by applying a layer of tin on the leads of an assembled TAB semiconductor package. Tin is applied to the TAB semiconductor package leads by an immersion plating process. Residues from the plating process are then removed from the TAB package and the plated leads are heated to relieve stresses developed in the plated tin.

DETAILED DESCRIPTION OF THE DRAWINGS

TAB was developed as a process to automate attaching many lead wires to a semiconductor die thereby reducing the time and cost of semiconductor package assembly. As semiconductor lead counts continually increase, TAB's automated attachment has become an effective means to assemble semiconductor packages with small lead spacings. With a TAB assembly process, a machine simultaneously attaches one end of all the leads on a TAB lead frame to a semiconductor die. During attachment of a tin plated copper TAB lead frame to a semiconductor die and subsequent steps in manufacturing a TAB semiconductor package, reactions occur to the lead frame's metal composition causing intermetallic compounds to form. For tin plated copper TAB lead frames, copper combines with tin creating a copper-tin intermetallic compound. As copper migrates through the metal structure to the lead surface, reliable circuit board bonding of the TAB package is reduced thereby reducing the package's usefulness.

Extended periods of heating are required in various steps of manufacturing a TAB semiconductor package. The time and temperature varies depending on the type of materials, type of equipment, type of semiconductor die, burn-in requirements, and various other factors. All of these steps contribute to the formation of copper-tin intermetallic compounds on TAB leads, consequently it is preferable to apply the proper amount of tin after TAB semiconductor package manufacturing is complete.

The various aspects of the invention will be more fully understood from the accompanying figures and descriptions that follow.

Even though circuit boards in the present disclosure can be construed as fiberglass epoxy printed circuit boards, it will be understood that the present invention is just as applicable to other boards on which circuits are bonded such as ceramic, silicon or the like.

Figure 1:
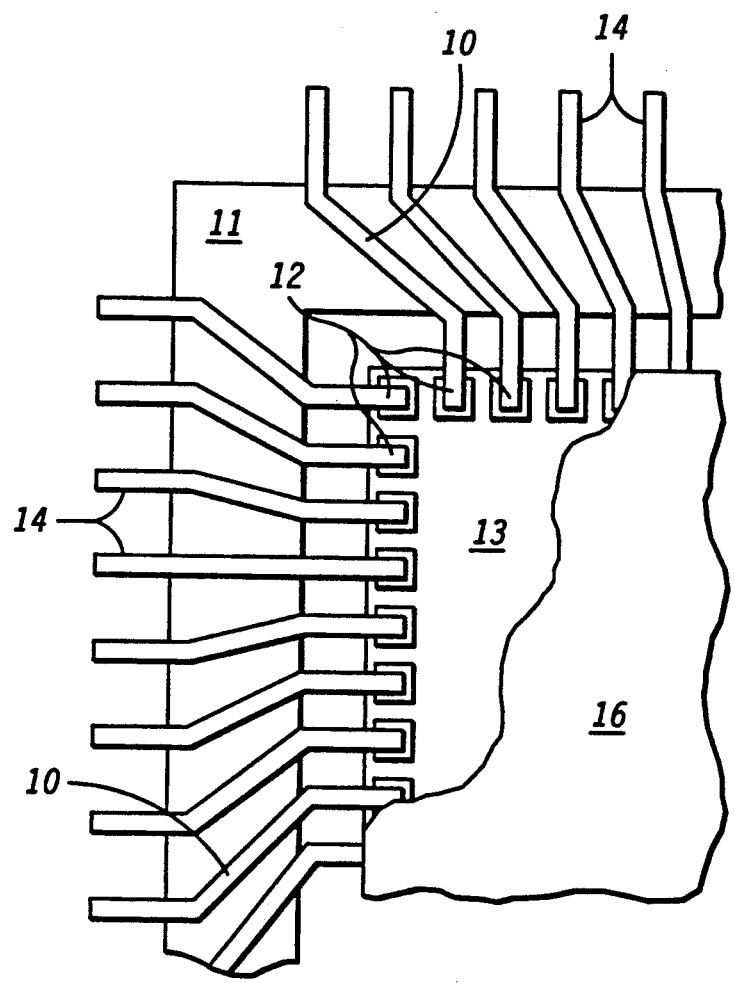
FIG. 1 is an enlarged cutaway plan view of one corner of a TAB semiconductor package.

FIG. 1 is a cutaway plan view of one corner of a TAB semiconductor package. Thin, narrow tin plated copper leads 10 are held in place by a thin plastic strip 11, which is generally a tape made of polyimide, polyester, or other suitable non-conductor. For lead attachment, inner most lead ends (inner leads) 12 of the TAB conductors are placed over semiconductor die 13. A bonding tool presses the conductors against bonding pads on the die and applies sufficient heat to create an eutectic bond between the TAB lead frame inner leads and the semiconductor die. Generally, all the inner leads are attached to the die by this process which is referred to as inner lead bonding (ILB). Outer leads 14 are the lead section attached to a circuit board. Generally that will be the lead ends furthermost from die 13.

Spacing between the inner leads is very small, generally less than 50 microns, and is usually the same as the conductors width. If the tin plating on the leads is too thick, heat and pressure applied during ILB can cause tin (or tin eutectics) to flow between these narrowly spaced leads creating electrical shorts and resulting in a defective package. Tin thickness, plated onto the TAB lead frame during lead frame manufacturing, is determined by the amount of tin required to produce eutectic inner lead bonding to the semiconductor die yet not produce electrical shorts between the inner leads during the bonding. This tin thickness on the inner leads is critical to insuring proper electrical contact to the semiconductor die, and therefore establishes the amount of tin plated onto the lead frame including the amount of tin on the outer leads for circuit board bonding. Intermetallic compound formation during TAB semiconductor package manufacturing, storage, burn-in, and other operations will continually reduce the amount of tin and increase the amount of copper on the surface of the outer leads.

For applications where a semiconductor die requires additional environmental protection, an optional protective coating 16 is applied. The optional protective coating is usually some type of liquid silicone, epoxy, or other comparable coating, dispensed onto the die and innermost lead sections then heated to cure into a solid. Heat used during curing also enhances intermetallic compound formation and further reduces the amount of tin on the lead surface.

With the increased emphasis on semiconductor quality and reliability, burn-in is performed on many packaged semiconductor devices to help identify non-reliable devices. Burn-in is a procedure of accelerating failure occurrences in a semiconductor device by operating the semiconductor device at elevated temperature. Burn-in varies in duration and temperature, but typically is 125 degrees centigrade for 24, 48, or 72 hours. This heating procedure also enhances intermetallic compound formation.

Figure 2:
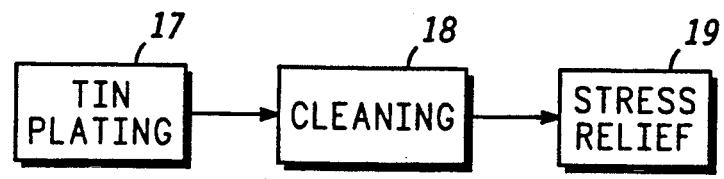
FIG. 2 is a TAB lead bonding improvement process flow chart.

FIG. 2 is a process flow chart for TAB semiconductor package lead bonding improvement.

Tin plating step 17 is performed on the TAB leads after a semiconductor device is mounted and attached to a TAB lead frame. In the preferred embodiment, tin is plated by an immersion plating process. During this immersion plating, the TAB semiconductor package is completely submerged in a solution suitable for immersion plating tin. Generally these plating solutions contain tin dissolved in an acid. One such suitable solution is Shipley Corporation's "LT34 Tinposit". Immersion plating is a chemical reducing process in which copper, that has migrated to the TAB lead surface, donates an electron to the dissolved tin reducing the tin out of solution and depositing it on the lead. When the copper can no longer donate electrons to the solution, the reaction ceases and deposition of tin stops. The amount of tin deposited is also dependent on the immersion time length and the solution temperature. Plating will occur at temperatures ranging from approximately 25 to 70 degrees centigrade, but the lower temperatures require longer periods of time to plate the same thickness of tin. The variable time and temperature combinations provide this process with accurate control of plating thin layers of tin. In the preferred mode, approximately 0.4 microns will be plated onto TAB semiconductor package leads during immersion in a solution at 60 degrees centigrade for a time of 2.5 minutes. At lower temperatures more time is required. For example, at 25 degrees centigrade fifteen minutes may be required, whereas, at 70 degrees centigrade one minute may be sufficient. Another advantage of this immersion plating process is the plating occurs only on surfaces containing copper, not on the plastic lead support tape or other non-copper materials. Consequently plating equipment is simplified and the complete TAB packaged semiconductor can be immersed in the plating solution. If a tin lead compound is to be plated onto the outer leads instead of pure tin, the process flow remains unchanged and the plating solution is modified to become the electron donor instead of the copper. Immersion plating can be performed on any combination of packages from individual packages to large numbers of packages in carriers or on reels.

Cleaning step 18 removes plating residues from the package. Plating solution must be removed so no residual contamination is left on the TAB semiconductor package. In the preferred embodiment, the plated material is rinsed with deionized water which permits detection of complete residue removal by measuring the resistance of the water after flowing over the plated material. The rinse is complete when the resistance of the deionized rinse water is greater than one million ohms.

Stress relief step 19 eliminates stresses developed in the plated material resulting from the plating procedure. During stress relief, the plated material is heated increasing thermal vibrations of the molecules and allowing them to redistribute, thereby reducing internal stresses. Without this stress relief, stress forces will cause the plated material to form very small tin filaments protruding from the material's surface. On TAB packaged semiconductors these filaments can form shorts between the TAB leads creating a defective package. Stress relief can be accomplished by either annealing or reflowing the tin plated leads. In the reflow process, the plated leads are heated to a temperature above the plated tin's 232 degree centigrade melting point for a time sufficient to allow redistribution of the stress forces. The anneal process heats the plated tin to a temperature within a range of approximately 100 to 225 degrees centigrade and maintains that temperature until the stress forces are redistributed. The lower temperature anneal process takes a longer time to eliminate stresses than the reflow process. In the preferred mode, the tin plated TAB leads are heated to approximately 215 degrees centigrade until the stresses are eliminated. If a tin lead compound is plated onto the outer leads instead of pure tin, stress relief step 19 is not required since plating stresses are not induced in such tin lead compounds.

The TAB semiconductor package outer leads can now be reliably bonded to a circuit board.

By now it should be appreciated that there has been provided a novel way to improve the outer lead bonding characteristics of TAB packaged semiconductor devices.

We claim:

1. A method for improving bonding characteristics of the outer leads of an assembled TAB semiconductor package after intermetallic compounds have formed on the leads which comprises:

plating tin with an immersion plating process onto the TAB leads thereby coating intermetallic compounds with tin;

rinsing the package to completely remove residual plating solution; and heating the plated leads to eliminate plating induced stresses created in the tin during the plating process.

2. The method of claim 1 including complete immersion of the TAB semiconductor package in the plating solution.

3. The method of claim 1 wherein the plating process results in a tin plating less than one micron thick.

4. A process for improved circuit board bonding of TAB semiconductor package outer leads which comprises:

plating tin on the outer leads using an immersion tin process wherein the entire packaged semiconductor device is immersed in a tin plating solution with a temperature of less than 70 degrees centigrade;

removing residual plating solution from the packaged semiconductor device; and heating the plated outer leads to remove plating induced stresses in the plated tin.

5. A process for preparing an assembled TAC semiconductor package having a plurality of leads for bonding to a circuit board which comprises:

plating the leads of the TAB semiconductor package; and removing plating residue from the TAB package by rinsing the plated package with deionized water until the water, after flowing over the assembly, has a resistance greater than one million ohms.

6. The method of claim 5 wherein the plating step is an immersion plating by immersing the TAB semiconductor package in a plating solution.

7. The method of claim 6 further including immersion plating with a solution temperature within a range from 25 to 70 degrees centigrade, and an immersion period ranging from one to fifteen minutes.

8. The method of claim 5 further including heating the plated leads to remove stresses induced in the plating by the plating step.

9. The method of claim 9 wherein stresses developed in the plating during the plating step are relieved by heating the plating to a temperature between 100 and 225 degrees centigrade.

* * * * *

UNITED STATES PATENT AND TRADEMARK OFFICE
CERTIFICATE OF CORRECTION

PATENT NO. : 5,075,258

DATED : December 24, 1991

INVENTOR(S) : Carney et al

It is certified that error appears in the above-identified patent and that said Letters Patent is hereby corrected as shown below:

Column 6, claim 5, line 9, change "TAC" to --TAB--.

Column 6, claim 9, line 28, change "9" to --8--.

Signed and Sealed this

Twentieth Day of April, 1993

Attest:

MICHAEL K. KIRK

*Attesting Officer*     Acting Commissioner of Patents and Trademarks